United States Patent
Kim et al.

(10) Patent No.: US 7,539,229 B2
(45) Date of Patent: May 26, 2009

(54) SURFACE EMITTING LASER DEVICE HAVING DOUBLE CHANNELED STRUCTURE

(75) Inventors: Taek Kim, Gyeonggi-do (KR); Ki-sung Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 281 days.

(21) Appl. No.: 11/193,411

(22) Filed: Aug. 1, 2005

(65) Prior Publication Data

US 2006/0140234 A1    Jun. 29, 2006

(30) Foreign Application Priority Data

Dec. 28, 2004 (KR) .................. 10-2004-0113925

(51) Int. Cl.
*H01S 5/00* (2006.01)

(52) U.S. Cl. .............................. 372/46.01; 372/46.013; 372/46.015; 372/46.016

(58) Field of Classification Search ..............................
372/46.011–46.015, 50.11, 50.124
See application file for complete search history.

(56) References Cited

U.S. PATENT DOCUMENTS

| | | | | |
|---|---|---|---|---|
| 5,212,701 A | * | 5/1993 | Choquette et al. | 372/45.01 |
| 5,446,752 A | * | 8/1995 | Ackley et al. | 372/46.01 |
| 6,021,146 A | * | 2/2000 | Jiang et al. | 372/50.124 |
| 6,243,407 B1 | * | 6/2001 | Mooradian | 372/92 |
| 6,611,543 B2 | * | 8/2003 | Hwang | 372/50.11 |
| 6,810,065 B1 | * | 10/2004 | Naone | 372/96 |
| 6,931,042 B2 | * | 8/2005 | Choquette et al. | 372/43.01 |
| 2003/0053503 A1 | * | 3/2003 | Yang | 372/45 |
| 2005/0089074 A1 | * | 4/2005 | Koelle et al. | 372/50 |

* cited by examiner

*Primary Examiner*—Minsun Harvey
*Assistant Examiner*—Xnning Niu
(74) *Attorney, Agent, or Firm*—Buchanan Ingersoll & Rooney PC

(57) ABSTRACT

Embodiments provide a vertical external cavity surface emitting laser (VECSEL) that may provide a uniform current density in an active layer using a double current injecting channel. The surface emitting laser device may include a double channel current injection structure for uniformly applying current to an active layer, wherein the double channel current injection structure may include: a first current injection channel, which may allow current to be injected toward a central portion of an aperture, which may be a light beam output region formed in the active layer, and may have a smaller diameter than the aperture: and a second current injection channel, which may allow current to be injected toward an edge of the aperture and may be located around the aperture.

32 Claims, 8 Drawing Sheets

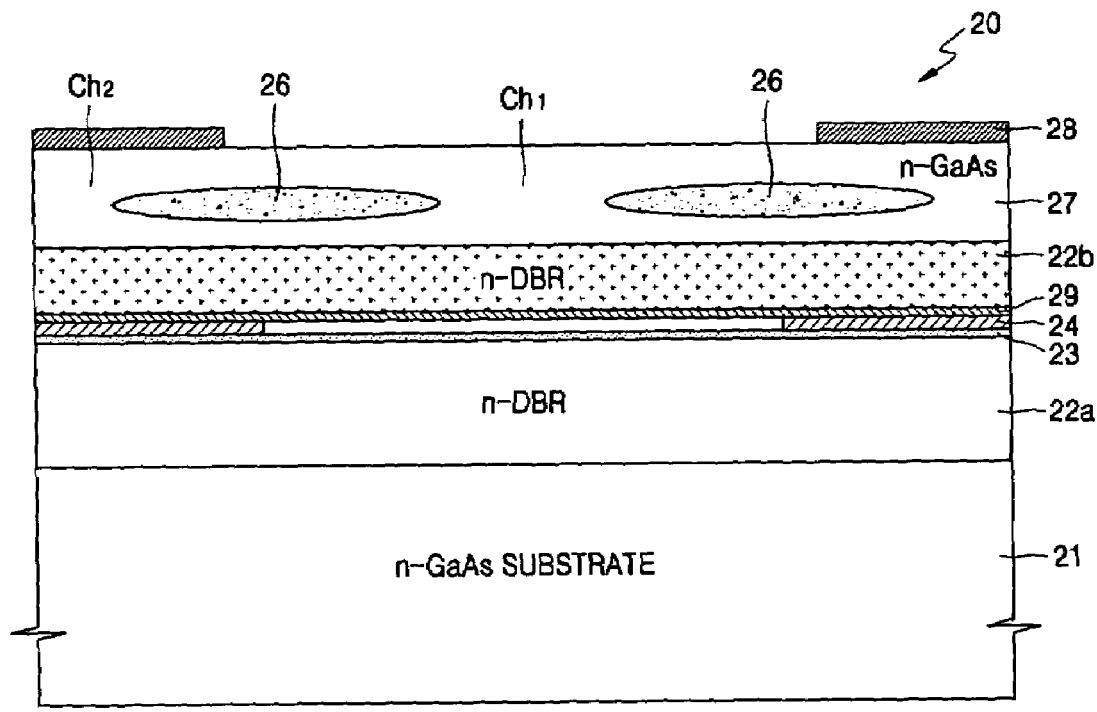
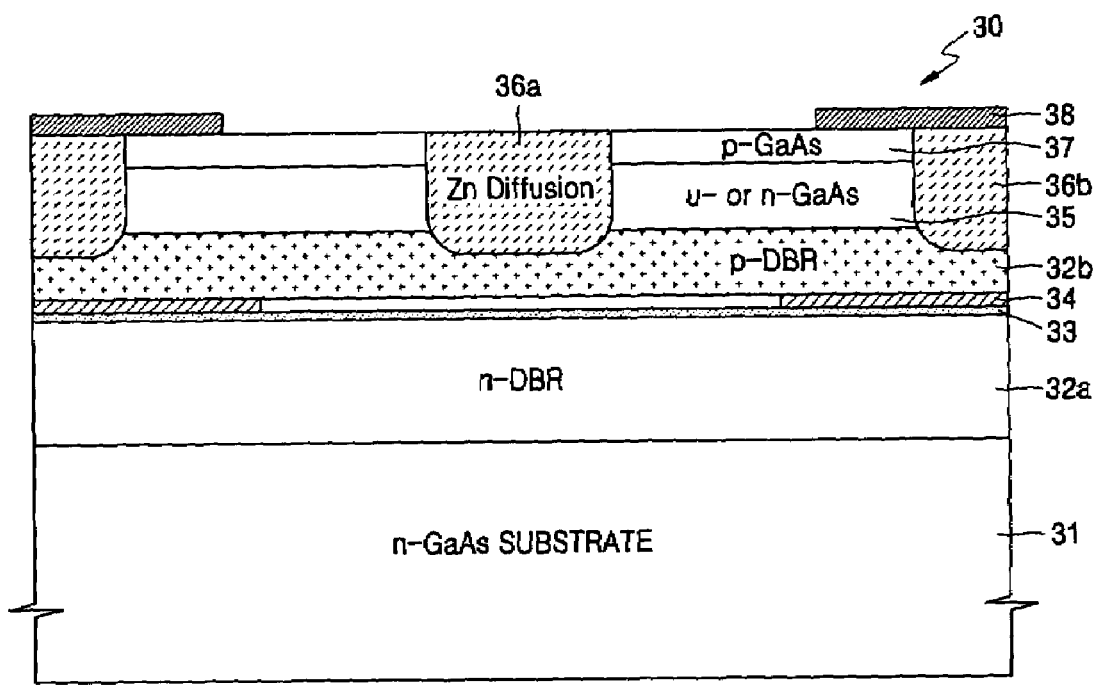

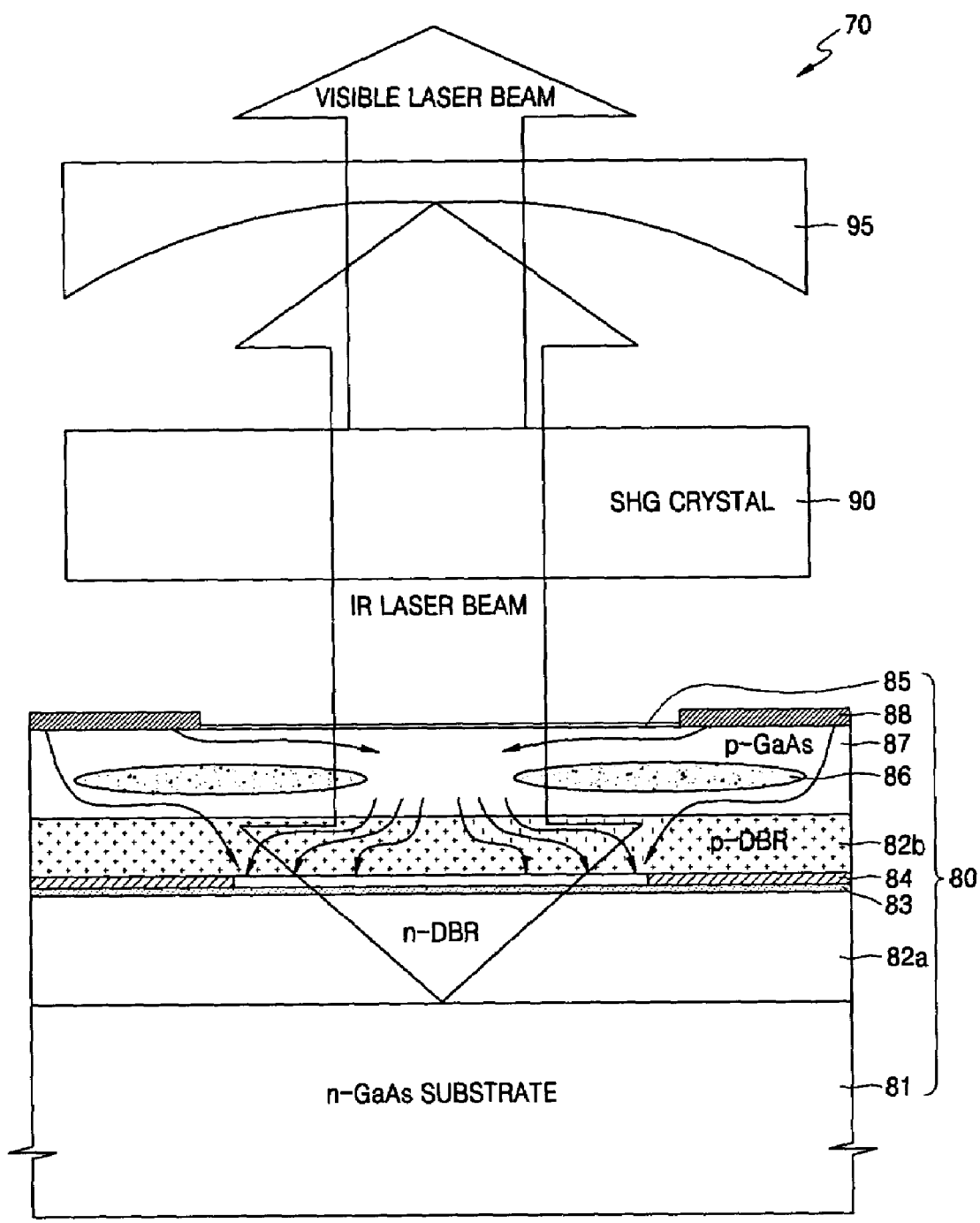

SURFACE EMITTING LASER DEVICE HAVING DOUBLE CHANNELED STRUCTURE

CROSS-REFERENCE TO RELATED PATENT APPLICATION

This application claims the benefit of Korean Patent Application No. 10-2004-0113925, filed on Dec. 28, 2004, in the Korean Intellectual Property Office, the disclosure of which is incorporated herein in its entirety by reference.

BACKGROUND OF THE DISCLOSURE

1. Field of the Disclosure

Embodiments of the present disclosure may include a surface emitting laser device having a double-channel structure, and more particularly, a vertical external cavity surface emitting laser (VECSEL) that may obtain a uniform current density in an active layer using two current injection channels.

2. Description of the Related Art

FIG. 1 is a cross-sectional view illustrating a structure of a vertical cavity surface emitting laser (VCSEL) that emits a laser beam in a direction vertical to a substrate. Referring to FIG. 1, a conventional VCSEL 100 has a structure in which a lower distributed Bragg reflector (DBR) layer 113, an active layer 114, and an upper DBR layer 116 are consecutively stacked on a substrate 111 made of n-GaAs. The lower and upper DBR layers 113 and 116 are reflection layers having high reflectivity with respect to the oscillation wavelength of the laser. The lower DBR layer 113 is an n-type DBR layer doped with an n-type dopant, and the upper DBR layer 116 is a p-type DBR layer doped with a p-type dopant. A metal contact 117 for applying current to the active layer 114 is formed in the upper DBR layer 116. In this structure, when current is applied to the active layer 114, light is emitted from the active layer 114 due to the recombination of holes and electrons in the active layer 114. The light is emitted through the upper DBR layer 116 after being repeatedly reflected between the upper DBR layer 116 and the lower DBR layer 113 and amplified in the active layer 114.

However, in the case of the VCSEL 100, since a resistance in a horizontal direction is considerably greater than a resistance in a vertical direction, the current density is not uniform over the active layer 114 and a current crowding phenomenon, i.e., the concentration of current near the edge of an aperture, which is a light emitting region of the active layer 114, occurs. A curve indicated by "A" in FIG. 1 is a current density profile of the active layer 114. As is seen from the curve "A", the current density is remarkably reduced in a central region of the active layer 114 due to the high resistance in the horizontal direction. This phenomenon causes a single transverse mode oscillation to occur in the VCSEL 100. To solve this problem, as depicted in FIG. 1, conventionally the size of the aperture of the active layer 114 is limited to approximately 5 μm by forming an oxide layer 115 by selectively oxidizing the periphery of a lower surface of the upper DBR layer 116. An ion implantation layer can be used instead of the oxide layer 115. Therefore, the conventional VCSEL 100 has a drawback in that its output power is merely a few mW due to the small aperture.

A vertical external cavity surface emitting laser (VECSEL) is a laser device designed to realize a high output operation. The VECSEL can obtain a power of at least a few hundreds mW due to a gain region enlarged using an external mirror.

FIG. 2 is a cross-sectional view illustrating a VECSEL. Referring to FIG. 2, a conventional VECSEL 120 includes a substrate 121, a lower DBR layer 122, an active layer 123, an upper DBR layer 124, and a concave external mirror 126. Here, laser cavities are respectively formed between the lower DBR layer 122 and the upper DBR layer 124 and between the lower DBR layer 122 and the concave external mirror 126. In this structure, light generated in the active layer 123 reciprocates in the active layer 123 while being repeatedly reflected between the lower DBR layer 122 and the upper DBR layer 124 and between the lower DBR layer 122 and the external mirror 126. A portion of the light having a wavelength $\lambda_2$ amplified in the active layer 123 through the above process is emitted as a laser beam to the outside through the external mirror 126, and the other portion of the light is reused for optical pumping via reflection.

There are two methods of exciting the active layer 123 in the VECSEL 120. A first method is, as depicted in FIG. 2, an optical pumping method in which a light beam $\lambda_1$ having a shorter wavelength than the laser beam $\lambda_2$ emitted from the active layer 123 is directed to enter the active layer 123 using a pump laser 127. The other method is, like the VCSEL depicted in FIG. 1, an electric pumping method in which current is applied to the active layer 123 through a metal contact formed on the upper DBR layer 124. However, when the electric pumping method is used, the drawbacks of the VCSEL described above still occur. Furthermore, in the case of the VECSEL 120, the aperture is as large as 20-100 μm for a high output power. Therefore, the problem that current is concentrated near the edge of the aperture becomes more severe, and it is more difficult to achieve single transverse mode oscillation for a higher output power.

A laser device in FIG. 3 developed to overcome the above-described drawbacks is disclosed in U.S. Pat. No. 6,243,407 to Aram Mooradian, entitled "High power laser devices" and filed on Jul. 7, 1997. Referring to FIG. 3, a laser device 130 includes a p-type DBR layer 131, an active layer 132, an n-type DBR layer 133, a substrate 134, and an external mirror 138. A circular contact layer 135 is formed on a lower surface of the p-type DBR layer 131, and an annular contact layer 136 is formed on an upper surface of the substrate 134. Current is applied to the active layer 132 through the contact layers 135 and 136. The substrate 134 is formed of n-GaAs, which is transparent to the oscillation wavelength of the laser device, to a thickness of approximately 500 μm. In this structure, laser cavities are respectively formed between the p-type DBR layer 131 and the n-type DBR layer 133 and between the p-type DBR layer 131 and the external mirror 138. A second harmonic generating (SHG) crystal 137, which doubles a frequency of light, can be additionally disposed between the external mirror 138 and the substrate 134.

As seen from FIG. 3, the laser device 130 disclosed in the above U.S. Patent publication is designed such that light generated in the active layer 132 passes through the substrate 134. That is, the substrate 134 is disposed in the laser cavity formed between the p-type DBR layer 131 and the external mirror 138. This structure mitigates the concentration of current described above by allowing the current to diffuse in a horizontal direction while flowing through the substrate 134, which is relatively thick.

However, the laser device 130 depicted in FIG. 3 has the following drawbacks. That is, the absorption of free carriers by n-GaAs, which is commonly used as a material for the substrate 134, limits the output power and efficiency of the device. This loss is not negligible because the thickness of the n-GaAs substrate 134 through which the beam passes reaches a few hundreds of μm.

Also, in the case of a conventional VECSEL, about 30% of the total optical energy being amplified in the active layer 132 distributes in the laser cavity between the upper and lower DBR layers, and about 70% of the optical energy distributes in the laser cavity between the lower DBR layer and the external mirror. Meanwhile, in the case of the laser device depicted in FIG. 3, about 30% of the optical energy is distributed in the laser cavity formed between the DBR layer 131 and the external mirror 138 to reduce a loss due to the absorption of free carriers. However, the conversion efficiency of the SHG crystal 137 disposed between the substrate 134 and the external mirror 138 increases in proportion to the intensity of the optical energy. Accordingly, the overall efficiency of the laser device 130 depicted in FIG. 3 decreases. The conversion efficiency of the SHG is further reduced since the distance between the active layer 132 and the external mirror 138 is great and light reaching the SHG crystal 137 is dispersed to some extent.

Also, it is very difficult to meet resonant conditions since the substrate 134 and air are present between the external mirror 138 and the p-type DBR layer 131. Also, as the optical path is longer, a greater degree of precision is required when forming the concave surface of the external mirror 138 so that light reflected by the external mirror 138 can converge on the p-type DBR layer 131.

Furthermore, a process of manufacturing the laser device is complicated since the manufacturing is performed on both upper and lower surfaces of the substrate 134, not only one surface of the substrate 134.

SUMMARY OF THE DISCLOSURE

Embodiments of the present disclosure may provide a simple, high power vertical external cavity surface emitting laser (VECSEL) that may implement uniform current diffusion in a horizontal direction with a simple structure, does not cause a loss due to the absorption of free carriers, and can be manufactured through simple processes.

According to an aspect of the present invention, there may be provided a surface emitting laser device comprising a double channel current injection structure for uniformly applying current to an active layer, the double channel current injection structure including: a first current injection channel, which may allow current to be injected toward a central portion of an aperture, which may be a light beam output region formed in the active layer, and may have a smaller diameter than the aperture: and a second current injection channel, which may allow current to be injected toward an edge of the aperture and may be located around the aperture.

The double channel current injection structure may include: a current transport layer allowing current to be injected into the active layer; and an annular high resistance region buried in the current transport layer, wherein the high resistance region may have an inner diameter smaller than a diameter of the aperture such that the first current injection channel may be formed inside an inner radius of the annular high resistance region and an outer diameter greater than the diameter of the aperture such that the second current injection channel may be formed outside an outer radius of the annular high resistance region.

The double channel current injection structure may include: a current shielding layer blocking flow of current into the active layer; a current transport layer formed on the current shielding layer and transporting current; a first current passing layer forming the first current injection channel by vertically extending through central portions of the current transport layer and the current shielding layer; and a second current passing layer forming the second current injection channel by vertically extending through edges of the current transport layer and the current shielding layer.

Alternatively, the double channel current injection structure may include: a first current transport layer allowing current to be injected into the active layer; a current shielding layer formed on the first current transport layer and blocking flow of current into the active layer; a second current transport layer formed on the current shielding layer and transporting current; a first current passing layer forming the first current injection channel by vertically extending through central portions of the second current transport layer and the current shielding layer to contact at least an upper surface of the first current injecting layer; and a second current passing layer forming the second current injection channel by vertically extending through edges of the second current transport layer and the current shielding layer to contact at least an upper surface of the first current injection layer.

According to another aspect of the present disclosure, there may be provided a surface emitting laser device comprising: a substrate; a lower DBR (distributed Brag reflector) layer formed on the substrate; an active layer formed on the lower DBR layer and generating light having a predetermined wavelength; an upper DBR layer formed on the active layer; a current transport layer formed on the upper DBR layer and transporting current; and an annular high resistance region buried in the current transport layer.

According to another aspect of the present disclosure, there may be provided a surface emitting laser device comprising: a substrate; a lower DBR layer formed on the substrate; an active layer formed on the lower DBR layer and generating light having a predetermined wavelength; an upper DBR layer formed on the active layer; a current shielding layer formed on the upper DBR layer and blocking flow of current into the upper DBR layer; a current transport layer formed on the current shielding layer and transporting current; a first current passing layer vertically extending through central portions of the current transport layer and the current shielding layer to contact the upper DBR layer; and a second current passing layer that vertically extending through edges of the current transport layer and the current shielding layer to contact the upper DBR layer.

According to another aspect of the present disclosure, there may be provided a surface emitting laser device comprising: a substrate; a lower DBR layer formed on the substrate; an active layer formed on the lower DBR layer and generating light having a predetermined wavelength; an upper DBR layer formed on the active layer; a first current transport layer formed on the upper DBR layer; a current shielding layer formed on the first current transport layer and blocking flow of current into the first current transport layer; a second current transport layer formed on the current shielding layer; a first current passing layer vertically extending through central portions of the second current transport layer and the current shielding layer to contact at least an upper surface of first current transport layer; and a second current passing layer vertically extending through edges of the second current transport layer and the current shielding layer to contact at least an upper surface of first current transport layer.

BRIEF DESCRIPTION OF THE DRAWINGS

The above and other features and advantages of the present disclosure will become more apparent by describing in detail exemplary embodiments thereof with reference to the attached drawings in which:

FIGS. 6 through 10 are cross-sectional views illustrating structures of surface emitting laser devices according to various embodiments of the present disclosure; and FIG. 11 is a cross-sectional view illustrating a structure of a VECSEL according to the present disclosure.

DETAILED DESCRIPTION OF EXEMPLARY EMBODIMENTS OF THE DISCLOSURE

Figure 1:
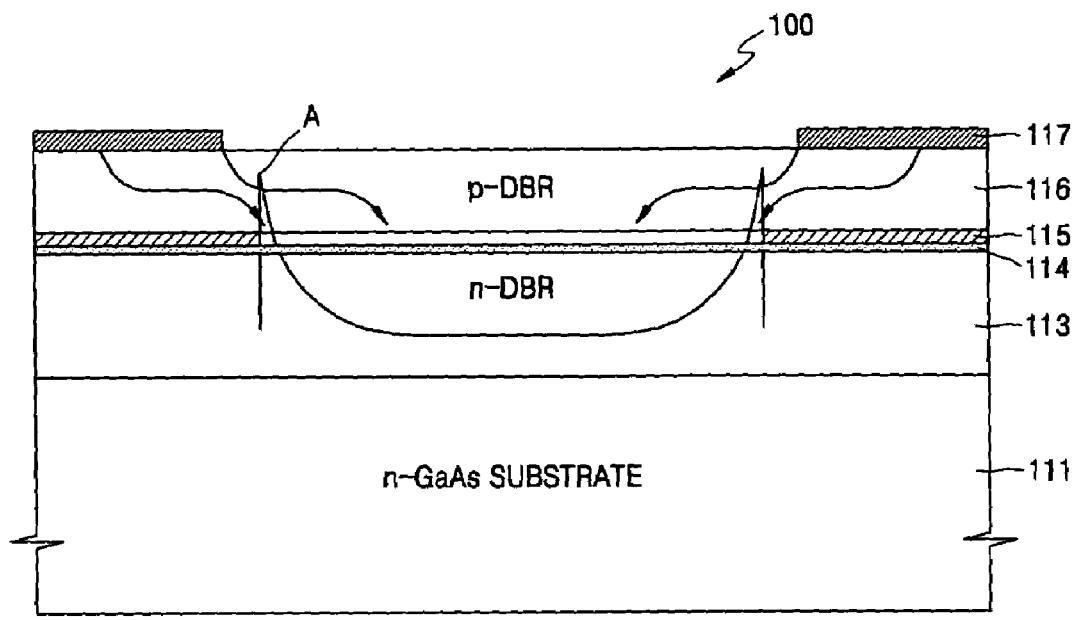
FIG. 1 is a cross-sectional view illustrating a structure of a conventional surface emitting laser.
Figure 2:
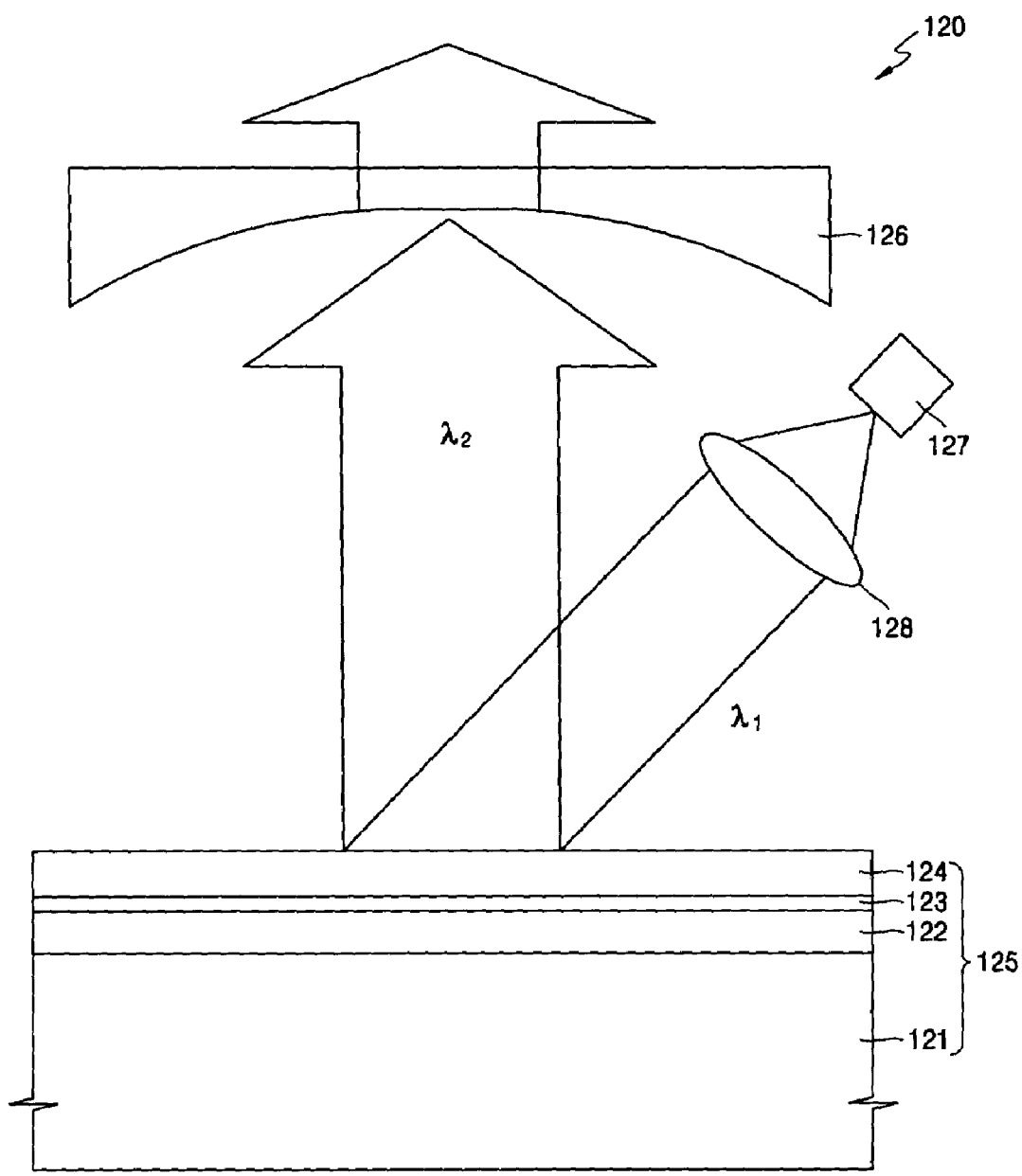
FIG. 2 is a cross-sectional view illustrating a structure of a conventional vertical external cavity surface emitting laser (VECSEL)
Figure 3:
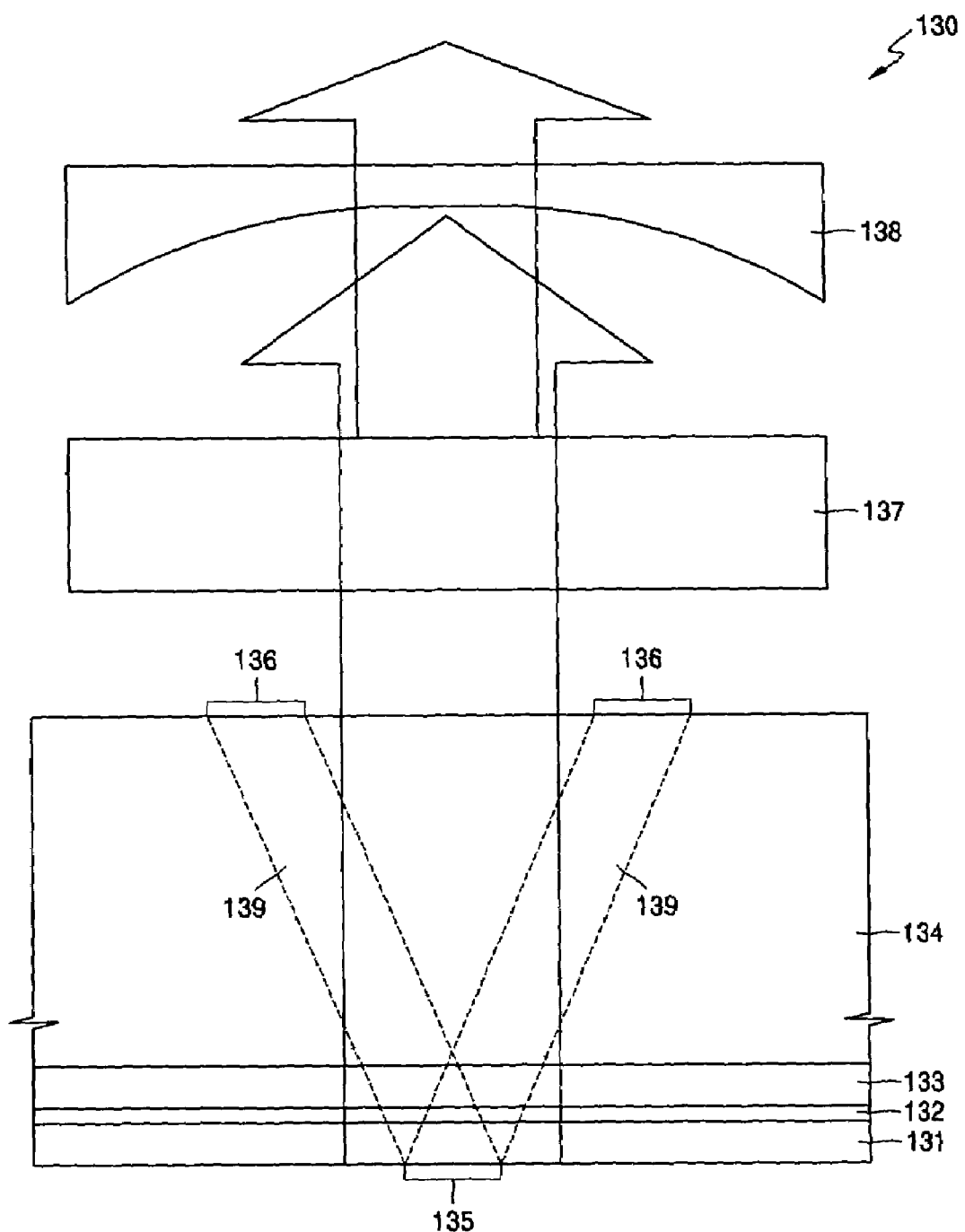
FIG. 3 is a cross-sectional view illustrating a structure of another conventional VECSEL.
Figure 4:
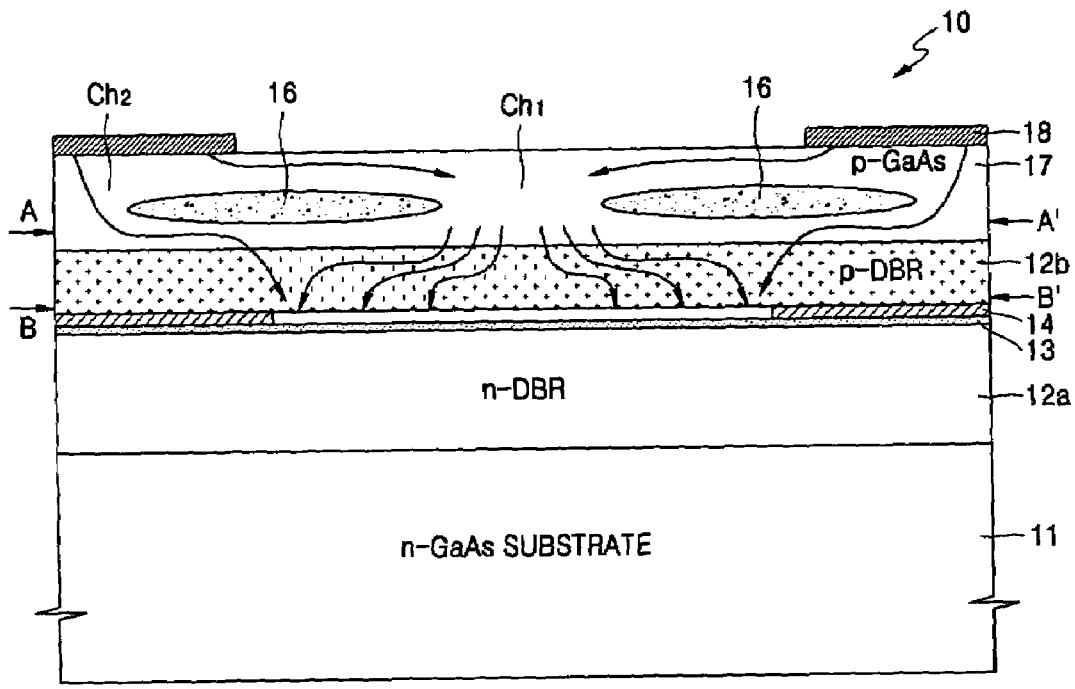
FIG. 4 is a cross-sectional view illustrating a structure of a surface emitting laser device according to an embodiment of the present disclosure.

FIG. 4 is a cross-sectional view illustrating a structure of a surface emitting laser device according to an embodiment of the present disclosure.

Referring to FIG. 4, a surface emitting laser device 10 according to an embodiment of the present disclosure may include a substrate 11, a lower distributed Bragg reflector (DBR) 12a formed on the substrate 11, an active layer 13 formed on the lower DBR layer 12a, an upper DBR layer 12b formed on the active layer 13, and a current transport layer 17 formed on the upper DBR layer 12b. An annular high resistance region 16 may be buried in the current transport layer 17. Also, as in a conventional surface emitting laser device, the size of an aperture which may be a light emitting region of the active layer 13 may be limited by forming an oxide layer 14 by selectively oxidizing the periphery of a lower surface of the upper DBR layer 12b. At this time, an ion implantation layer may be used instead of the oxide layer 14.

The substrate 11 may be formed of an n-type semiconductor material, such as n-GaAs. The active layer 13 generating light having a predetermined wavelength, for example, in an infrared range, may be formed in a multi-layered quantum well structure. The upper and lower DBR layers 12a and 12b may be reflection layers forming a multi-layer structure for a great reflectivity with respect to the oscillation wavelength of the laser device 10. The lower DBR layer 12a may be an n-type DBR layer doped with an n-type dopant, and the upper DBR layer 12b may be a p-type DBR layer doped with a p-type dopant. The current transport layer 17, which may transport currents applied to a metal contact 18 to the active layer 13, may be formed of a p-type semiconductor material, such as p-GaAs. However, the locations of the n-type and p-type are illustrative examples, and the locations of the p-type and the n-type may be switched. That is, a p-type substrate, a p-type lower DBR layer, an n-type upper DBR layer, and an n-type current transport layer 17 can be sequentially stacked.

Although two separate high resistance regions 16 are shown in FIG. 4, when viewed from the top of the laser device 10, one annular high resistance region 16 may be formed to face a region surrounding the aperture of the active layer 13. As depicted in FIG. 4, an inner diameter of the annular high resistance region 16 has to be smaller than a diameter of the aperture of the active layer 13, and an outer diameter thereof has to be greater than the diameter of the aperture. The high resistance region 16 can be formed to be completely buried in the current transport layer 17 using a conventional ion implantation method. For example, after implanting ions through an upper surface of the current transport layer 17 at an energy of about 300 to about 400 eV, the current transport layer 17 may be annealed. As a result, the high resistance region 16 formed by implanting ions may be completely buried in the current transport layer 17.

Due to the high resistance region 16, current applied to the metal contact 18 formed around an upper surface of the current transport layer 17 may enter the active layer 13 through first and second current injection channels Ch1 and Ch2, as indicated by arrows, by detouring the high resistance region 16 in the current transport layer 17. Accordingly, the current transport layer 17 and the high resistance region 16 form a double channelled current injection structure.

As described above, the inner diameter of the annular high resistance region 16 may be smaller than the diameter of the aperture of the active layer, and the outer diameter thereof may be greater than the diameter of the aperture. Therefore, the first current injection channel Ch1 formed inside an inner radius of the annular high resistance region 16 allows current to be injected toward the center of the aperture of the active layer 13. The second current injection channel Ch2 formed outside an outer radius of the annular high resistance region 16 may allow current to be injected toward an edge of the aperture. At this time, since, as indicated by arrows, the diameter of the first current injection channel Ch1 may be smaller than the diameter of the aperture of the active layer 13, the current passed through the first current injection channel Ch1 diffuses toward the edge of the active layer 13 from the center of the active layer 13. Since the second current injection channel Ch2 may be located around the aperture of the active layer 13, current passed through the second current injection channel Ch2 travels toward the edge of the active layer 13.

Figure 5A:
FIGS. 5A and 5B are current density profiles in a current injection channel and an active layer of a laser device according to the present disclosure.

FIG. 5A is a graph showing a current density profile at a cross-section A-A' of the current transport layer 17 when current is applied to the active layer 13 through the first and second current injection channels Ch1 and Ch2. Referring to FIG. 5A, the current density profile has double peaks, indicating that the current density at the central portion of the cross-section of the first current injection channel Ch1 is remarkably low. That is, the current density near the edge of the first current injection channel Ch1 has peaks P1 and P2. As described above, this may be because the resistance in the horizontal direction is remarkably greater than the resistance in the vertical direction. Also, in the case of the second current injection channel Ch2 underlying the metal contact 18, the current density may be maintained almost uniform but sharply drops outside the second current injection channel Ch2.

Figure 5B:
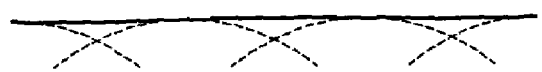

However, when the current reaches the active layer 13 through the narrow first and second current injection channels Ch1 and Ch2, the current distributes over the active layer 13, which may be wider than the first and second current injection channels Ch1 and Ch2, and may have a current density profile depicted in FIG. 5B.

That is, in the cross-section B-B', the currents passed through the first and second current injection channels Ch1 and Ch2 may be distributed as indicated by dotted lines. As a result, as indicated by a solid line in FIG. 5B, the overall current density distribution may be uniform over the active layer 13 as a result of the combination of the distributed currents. Accordingly, the laser device according to the present invention can achieve ideal single transverse mode oscillation. As a result, a high-output power, single transverse mode oscillating laser device may be manufactured since an active layer having a larger diameter of about 30 to about 200 μm than in the prior art can be formed.

A laser device 20 depicted in FIG. 6 has a structure in which a tunnel junction layer 29 is further included between an upper DBR layer 22b and an active layer 23. In the present invention, the tunnel junction layer 29 may facilitate the distribution of current in a horizontal direction as depicted in FIG. 5B by relatively increasing the resistance in a vertical direction. That is, the current density distribution in the active layer 23 may be more uniformized by increasing the resistance in a vertical direction using the tunnel junction layer 29, thereby enabling improved single traverse mode oscillation.

As is well known, the tunnel junction layer 29 has a structure in which a p+ type semiconductor layer and an n+ type semiconductor layer, which are relatively heavily doped with dopants, are joined together. It is known that when the concentrations of p-type and n-type dopants in the two semiconductor layers are increased, a status of the boundary between the semiconductor layers changes and current can flow through the two semiconductor layers due to a tunnelling effect that electrons passes through, rather jump, the energy barrier. As the doping concentrations are greater, the band gap becomes smaller and the resistance generated when the electrons passes through the energy barrier becomes smaller. Therefore, in general, a tunnel junction layer is used when there is a need to allow current to flow in a non-current flowing structure, such as an n-p-n junction. The doping concentration is increased as high as possible to lower the resistance. However, in an embodiment of the present disclosure, the doping concentration may be lowered to a level smaller than in conventionally used tunnel junctions to induce a high resistance when electrons pass the tunnel junction. As a result, while electrons pass the tunnel junction layer 29 having a high resistance in a vertical direction, current can travel a longer distance in the horizontal direction and the current density in the active layer 23 becomes relatively uniform.

In the case of the laser device 20 according to an embodiment of the present disclosure, the tunnelling effect does not occur if the doping concentrations of the p-type and n-type semiconductor layers forming the tunnel junction layer 29 are too low. If the doping concentrations are too high, a sufficiently uniform current distribution in the horizontal direction may not be achieved. Therefore, it is desirable that the doping concentrations be maintained at appropriate levels. In a conventionally used tunnel junction, doping may be performed to a concentration of approximately $10^{20}/cm^2$ to lower resistance. However, in the present invention the doping concentration is controlled to a range of about $5 \times 10^{18}$ to about $5 \times 10^{19}/cm^2$ to induce a sufficiently high resistance in the vertical direction. Also, a sufficiently thin tunnel junction layer 29 may be desirable to induce a tunnelling effect. The tunnel junction layer 29 may have a thickness smaller than tens of nanometers, preferably, about 50 nm.

In the case of the laser device 20 according to the present invention, the upper and lower DBR layers 22a and 22b may be formed of the same type of semiconductor material because current can flow through the tunnel junction layer 29. That is, as depicted in FIG. 6, both the upper and lower DBR layers 22a and 22b are n-type DBR layers doped with n-dopants. Also, a current transport layer 27 formed of an n-type semiconductor material, such as n-GaAs, may be present. In this case, the output power and efficiency of the laser device 20 increase since n-type semiconductor materials and n-type dopants absorb less free carriers than p-type semiconductor materials. As in the embodiment of FIG. 4, an annular high resistance region 26 buried in the current transport layer 27 may be formed using an ion implantation method. Limitations on the inner and outer diameters of the high resistance region 26 are the same as in the above description.

In the case of the laser device 20 in FIG. 6, current may be uniformly distributed in the active layer 23 due to the diffusion of current in the horizontal direction facilitated by the tunnel junction layer 29 and the two narrow current injection channels Ch1 and Ch2. Also, the output power and efficiency of the laser device 20 may be improved because the absorption of free carriers is relatively small due to the use of the n-type semiconductor material and n-type dopant.

FIG. 7 is a cross-sectional view illustrating a surface emitting laser device according to another embodiment of the present invention.

Referring to FIG. 7, a laser device 30 may include a substrate 31, a lower DBR layer 32a formed on the substrate 31, an active layer 33 formed on the lower DBR layer 32a, an upper DBR layer 32b formed on the active layer 33, a current shielding layer 35 formed on the upper DBR layer 32b, a current transport layer 37 formed on the current shielding layer 35, a first current passing layer 36a that contacts the upper DBR layer 32b through a central region of the current transport layer 37 and the current shielding layer 35, and a second current passing layer 36b that contacts the upper DBR layer 32b through edges of the current transport layer 37 and the current shielding layer 35. Also, as in the case of FIG. 4, an aperture, which may be a light emission region of the active layer 33, may be limited to a predetermined size by forming an oxide layer 34 by selectively oxidizing the periphery of a lower surface of the upper DBR layer 32b.

Here, the substrate 31 may be formed of an n-type semiconductor material, such as n-GaAs. The active layer 33 may be formed as a multi-layered quantum well structure and generates light having a predetermined wavelength, such as infrared rays. The upper and lower DBR layers 32a and 32b may be reflective layers forming a multi-layer structure to have a high reflectivity with respect to the oscillation wavelength of the laser device 30. The lower DBR layer 32a may be an n-type DBR layer doped with an n-type dopant, and the upper DBR layer 32b may be a p-type DBR layer doped with a p-type dopant. The current shielding layer 35 formed on the upper DBR layer 32b may electrically insulate the current transport layer 37 and the upper DBR layer 32b from one another. Accordingly, current applied to a metal contact 38 formed on an edge of the current transport layer 37 may enter the active layer 33 through the narrow first and second current passing layers 36a and 36b. To this end, the current transport layer 37, which may transport the current applied to the metal contact 38 to the first current passing layer 36a, may be formed of a p-type semiconductor material, such as p-GaAs. In this case, the current shielding layer 35 may be formed of an undoped semiconductor material, such as u-GaAs, or an n-type semiconductor material, such as n-GaAs. Instead of the semiconductor materials, other insulating materials may also be used for the current shielding layer 35.

The first and second current passing layers 36a and 36b may be formed by diffusing a p-type dopant from the current transport layer 37 into at least an upper surface of the upper DBR layer 32b according to a conventional diffusion method. The diffusion process may be simply performed by coating regions of the current transport layer 37 in which the first and second current passing layers 36a and 36b may be formed with an p-type dopant and annealing the resultant structure at a predetermined temperature for a predetermined duration of time. A suitable p-type dopant that may be used in the present invention may be Zn, Mg, C, etc., with Zn being preferred. Zn may have a high diffusion rate and may diffuse to the upper DBR layer 32b in a relatively short time at a relatively low temperature.

In the case of FIG. 7, the first current passing layer 36a may serve as a first current injection channel, and the second current passing layer 36b may serve as a second current injection channel. Accordingly, in this case, the current shielding layer 35, the current transport layer 37, and the first and second current passing layers 36a and 36b form a double channel current injection structure. Therefore, the first and second current passing layers 36a and 36b have to conform to the limitations on the first and second current injection channels described above with reference to FIG. 4. That is, the first current passing layer 36a may allow currents to be injected toward a central portion of the aperture of the active layer 33 and may have a smaller diameter than the aperture. Also, the second current passing layer 36b may allow current to be injected toward the edge of the aperture and may be located around the aperture. In this structure, the current injected through the first current passing layer 36a may distribute over the active layer 33, which may be wider than the first current passing layer 36a, and the current injected through the second current passing layer 36b travels toward the edge of the active layer 33. Therefore, a uniform current density distribution over the entire region of the active layer 33 may be obtained.

Figure 8:
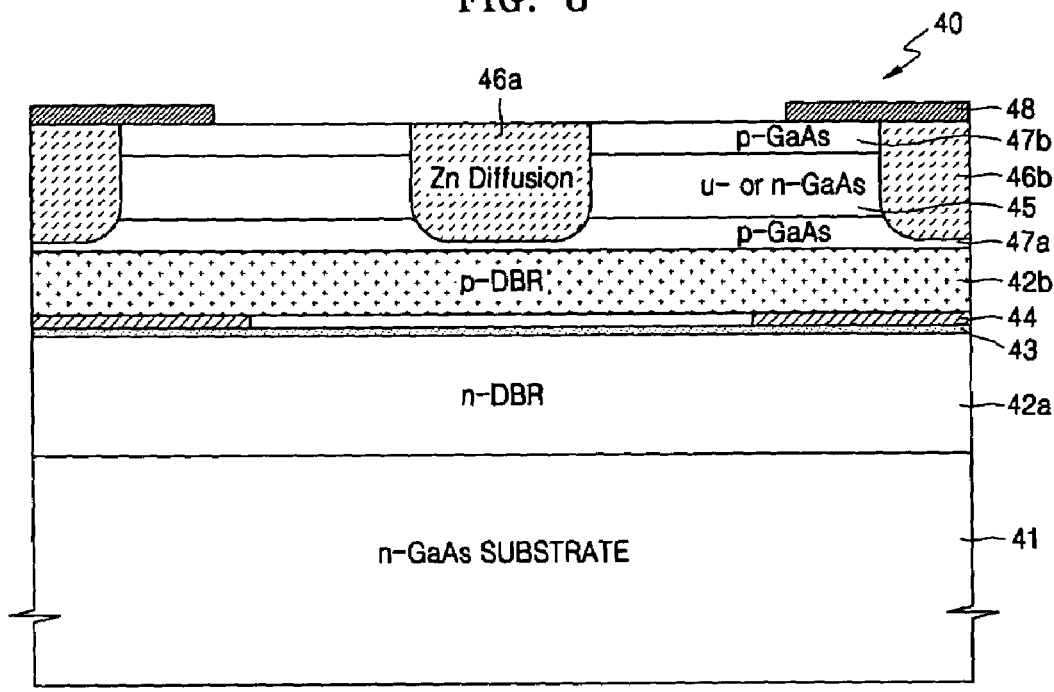

FIG. 8 is a cross-sectional view illustrating a structure of a surface emitting laser device according to another embodiment of the present disclosure.

A laser device 40 depicted in FIG. 8 may have a structure in which a current transport layer 47a may be further included between an upper DBR layer 42b and a current shielding layer 45, compared to the laser device 30 depicted in FIG. 7. That is, the laser device 40 may include a substrate 41, a lower DBR layer 42a formed on the substrate 41, an active layer 43 formed on the lower DBR layer 42a, an upper DBR layer 42b formed on the active layer 43, a first current transport layer 47a formed on the upper DBR layer 42b, a current shielding layer 45 formed on the first current transport layer 47a, and a second current transport layer 47b formed on the current shielding layer 45. A first current passing layer 46a may vertically extend through central portions of the second current transport layer 47b and the current shielding layer 45 to contact at least an upper surface of the first current transport layer 47a, and the second current passing layer 46b may vertically extend through edges of the second current transport layer 47b and the current shielding layer 45 to contact at least an upper surface of the first current transport layer 47a. Accordingly, in the case of the laser device 40 depicted in FIG. 8, a double channel current injection structure may be formed by the first and second current transport layers 47a and 47b and the first and second current passing layers 46a and 46b. In addition, an oxide layer 44 may be further formed to limit an aperture of the active layer 43 to a predetermined size.

Also, as in the laser device 30 in FIG. 7, the substrate 41 may be formed of an n-type semiconductor material, such as n-GaAs. The lower DBR layer 42a may be an n-type DBR layer doped with an n-type dopant, and the upper DBR layer 42b may be a p-type DBR layer doped with a p-type dopant. Both of the second current transport layer 47b, which transports current applied to a metal contact 48 to the first current passing layer 46a, and the first current transport layer 47a, which transports current supplied from the first and second current passing layers 46a and 46b to the upper DBR layer 42b, may be formed of a p-type semiconductor material, such as p-GaAs. The current shielding layer 45 may be formed of an undoped semiconductor material, such as u-GaAs, an n-type semiconductor material, such as n-GaAs, or various insulating materials. The first and second current passing layers 46a and 46b may be formed by diffusing a p-type dopant from the second current transport layer 47b into at least an upper surface of the first current transport layer 47a. The first current passing layer 46a may allow current to be injected toward a central portion of an aperture of the active layer 43 and has a smaller diameter than the aperture. The second current passing layer 46b may allow current to be injected toward edges of the aperture and is located around the aperture of the active layer 43.

In the case of the laser device 30 depicted in FIG. 7, a central portion of the upper DBR layer 32b may have a height smaller than other peripheral regions since the first current passing layer 36a protrudes into an upper surface portion of the upper DBR layer 32b. Therefore, the reflectivity in the central portion of the upper DBR layer 32b may be relatively lower than the other regions. As a result, according to the laser device 30 depicted in FIG. 7, in the central portion of the laser device 30 where light is emitted, a small loss due to the absorption by the first current passing layer 36a and a loss due to the reduced reflectivity in the central portion of the upper DBR layer 32b may occur. A loss of light due to the first current passing layer 36a itself may be trivial since the current shielding layer 35 and the current transport layer 37 may be formed to have a thickness of about 0.5 μm or less and a thickness of about 3 μm or less, respectively. This loss may be compensated for by forming the upper DBR layer 32b to be relatively thick to increase the overall reflectivity of the upper DBR layer 32b. As depicted in FIG. 8, the upper DBR layer 42b may be formed to have a uniform thickness by additionally forming the first current transport layer 47a between the upper DBR layer 42b and the current shielding layer 45 such that the first and second current passing layers 46a and 46b can extend only to the first current transport layer 47a. In this case, the loss of light in the central portion may be remarkably reduced since the reflectivity in the upper DBR layer 42b may be uniform. Also, current may be more uniformly distributed in a horizontal direction of the active layer 43 since the current injection path may be vertically long.

Figure 9:
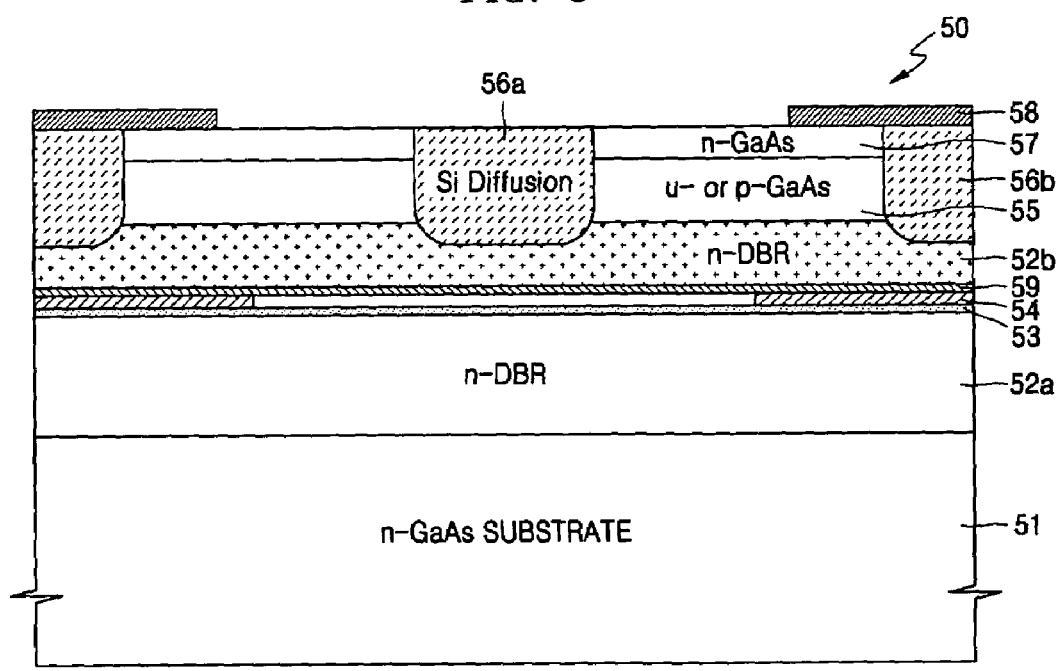

A surface emitting semiconductor laser device 50 depicted in FIG. 9 may have a structure in which a tunnel junction layer may be further included between the upper DBR layer 32b and the active layer 33 of the laser device 30 depicted in FIG. 7. As described above, the tunnel junction layer 59 may facilitate the distribution of current in a horizontal direction by increasing the resistance in a vertical direction to be larger than in the horizontal direction. Therefore, a current density distribution in the active layer 53 may become more uniform, thereby enabling high single transverse mode oscillation.

In the case of the laser device 50 depicted in FIG. 9, both the lower and upper DBR layers 52a and 52b may be formed of the same type of a semiconductor material since current can flow through the tunnel junction layer 59. That is, the upper and lower DBR layers 52a and 52b may be n-type DBR layers doped with an n-dopant. Also, a current transport layer 57 may be formed of an n-type semiconductor material, such as n-GaAs. However, a current shielding layer 55 may be formed of an undoped semiconductor material, such as u-GaAs, a p-type semiconductor material, such as p-GaAs, or various insulating materials. In this case, first and second current passing layers 56a and 56b may be formed by diffusing the n-type dopant from the current transport layer 57 at least to an upper surface of the upper DBR layer 52b. The n-type dopant that may be used for forming the first and second current passing layers 56a and 56b may be, but is not limited to, silicon Si. In this structure, the output power and efficiency of the laser device 50 may increase since the absorption of free carriers by the n-type semiconductor material and n-type dopant may be smaller than that by p-type semiconductor materials.

Figure 10:
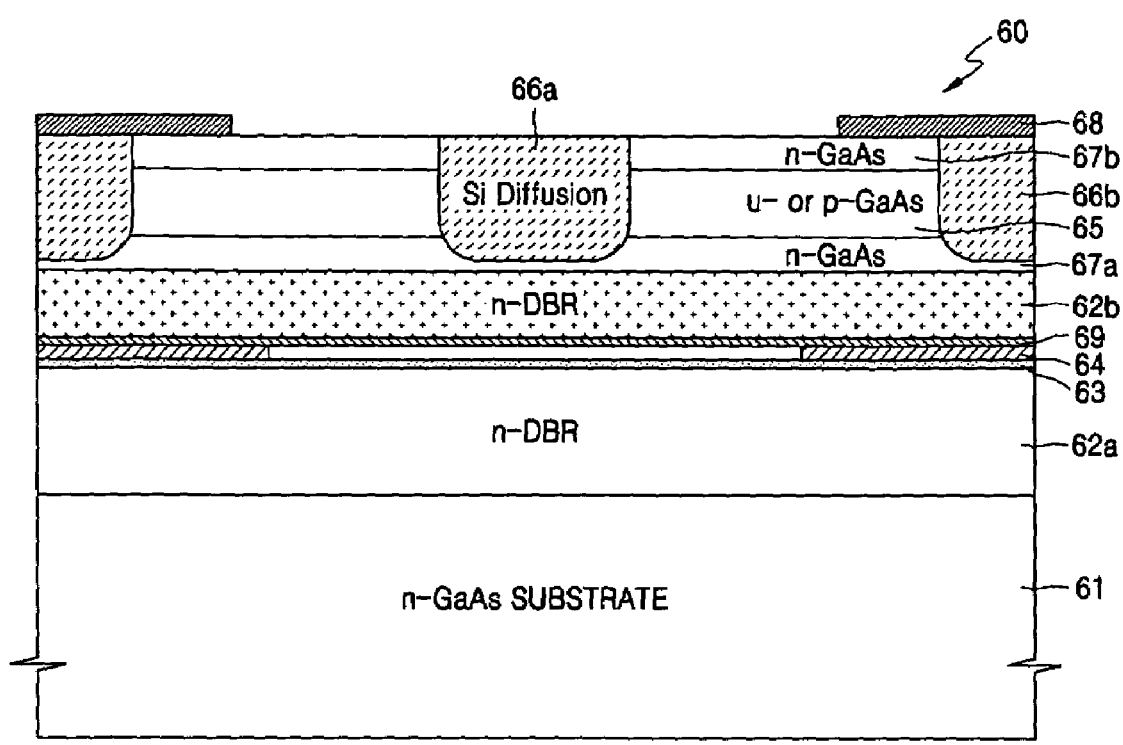

A surface emitting semiconductor laser device 60 depicted in FIG. 10 may have a structure in which a tunnel junction layer may be inserted between an upper DBR layer and an active layer 43 of the laser device 40 depicted in FIG. 8. The structure and function of the tunnel junction layer may be the same as described above. As described above, when a tunnel junction layer 69 is used, both lower and upper DBR layers 62a and 62b may be formed of the same type of a semiconductor material. That is, as depicted in FIG. 10, the upper and lower DBR layers 62a and 62b are n-type DBR layers doped with an n-dopant. Also, both first and second current transport layers 67a and 67b may be formed of an n-type semiconductor material, such as n-GaAs. However, a current shielding layer 65 can be formed of an undoped semiconductor material, such as u-GaAs, a p-type semiconductor material, such as p-GaAs, or various insulating materials. In this case, first and second current passing layers 66a and 66b may be formed by diffusing the n-type dopant from the second current transport layer 67b at least to an upper surface of the current transport layer 67a. As described above, an n-type dopant that can be used for forming the first and second current passing layers 66a and 66b may be silicon (Si), but other n-type dopants may also be used.

FIG. 11 is a cross-sectional view illustrating a structure of a vertical external cavity surface emitting laser (VECSEL) according to the present invention.

A VECSEL 70 depicted in FIG. 11 may be a laser device obtained by arranging an external mirror 95 having a concave shape outside a laser pumping unit 80, which has the same structure as the laser device in FIG. 4, to increase a gain region for a higher output power. The laser pumping unit 80 may include a substrate 81, a lower DBR layer 82a formed on the substrate 81, an active layer 83 formed on the lower DBR layer 82a, an upper DBR layer 82b formed on the active layer 83, a current transport layer 87 formed on the upper DBR layer 82b, and an annular high resistance region 86 completely buried in the current transport layer 87. Also, an oxide layer 84 may be additionally included to limit an aperture of the active layer 83 to a predetermined size.

Referring to FIG. 11, the concave external mirror 95 may be disposed a predetermined distance above the laser pumping unit 80. The external mirror 95 outputs a portion of light beam generated in the active layer 83 and reflects the rest of the light to be reabsorbed by the active layer 83. Therefore, the VECSEL 70 may include a first cavity between the lower DBR layer 82a and the upper DBR layer 82b and a second cavity between the lower DBR layer 82a and the external mirror 95. To this end, the length of an optical path between the external mirror 95 and the lower DBR layer 82a may be an integer multiple of the length of an oscillation wavelength. An anti-reflection layer 85 may be additionally formed on the current transport layer 87 to prevent reflecting of the light generated in the active layer 83 and proceeding toward the external mirror 95 at an interface between the current transport layer 87 and air or to prevent reflecting of light reflected from the external mirror 95 and proceeding toward the active layer 83 at an interface between the current transport layer 87 and air.

Also, as depicted in FIG. 11, in the VECSEL 70 according to the present invention, an SHG crystal 90, which doubles the frequency of light generated in the active layer 83, may be further disposed between the laser pumping unit 80 and the external mirror 95. The SHG crystal 90 may convert light in an infrared range generated in the laser pumping unit 80 into light in a visible range and outputs the same. The SHG crystal 90 can be crystals, such as potassium titanyl phosphate (KTP), $LiNbO_3$, periodically poled $LiNbO_3$ (PPLN), KTN, or $KnbO_3$.

Although the laser pumping unit 80 depicted in FIG. 11 may have the same structure as the laser device 10 depicted in FIG. 4, the laser devices 20, 30, 40, 50 and 60 depicted in FIGS. 6 through 10 can be used as the pumping unit of the VECSEL 70.

The structures and operations of surface emitting semiconductor lasers according to embodiments of the present disclosure are described above. As described above, the laser devices according to the present invention may enable single transverse mode oscillation with a larger aperture in their active layer than in the prior art since the active layer has an ideal current density distribution profile.

Therefore, a surface emitting semiconductor laser device having a high, stable output power may be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A surface emitting laser device comprising a double channel current injection structure for uniformly applying current to an active layer, the double channel current injection structure including:
    a first current injection channel, which allows current to be injected toward a central portion of an aperture, which is a light beam output region of the active layer, and has a smaller diameter than the aperture;
    a second current injection channel, which allows current to be injected toward an edge of the aperture and is located around the aperture;
    a current shielding layer blocking flow of current into the active layer;
    a current transport layer formed on the current shielding layer and transporting current;
    a first current passing layer forming the first current injection channel by vertically extending through central portions of the current transport layer and the current shielding layer; and
    a second current passing layer forming the second current injection channel by vertically extending through edges of the current transport layer and the current shielding layer.

2. The surface emitting laser device of claim 1, wherein the first and second current passing layers are formed by diffusing a dopant into the current transport layer and the current shielding layer.

3. A surface emitting laser device comprising a double channel current injection structure for uniformly applying current to an active layer, the double channel current injection structure including:
    a first current injection channel, which allows current to be injected toward a central portion of an aperture, which is a light beam output region of the active layer, and has a smaller diameter than the aperture;
    a second current injection channel, which allows current to be injected toward an edge of the aperture and is located around the aperture;
    a first current transport layer allowing current to be injected into the active layer;

a current shielding layer formed on the first current transport layer and blocking flow of current into the active layer;

a second current transport layer formed on the current shielding layer and transporting current;

a first current passing layer forming the first current injection channel by vertically extending through central portions of the second current transport layer and the current shielding layer to contact at least an upper surface of the first current transport layer; and a second current passing layer forming the second current injection channel by vertically extending through edges of the second current transport layer and the current shielding layer to contact at least an upper surface of the first current transport layer.

4. The surface emitting laser device of claim 3, wherein the first and second current passing layers are formed by diffusing a dopant into the first and second current transport layers and the current shielding layer.

5. The surface emitting laser device of claim 1 further comprising an external mirror that is disposed a predetermined distance above the double channel current injection structure, externally outputs a portion of the light generated in the active layer, and reflects the rest of the light to be reabsorbed by the active layer.

6. A surface emitting laser device comprising:
a substrate;
a lower DBR (distributed Brag reflector) layer formed on the substrate;
an active layer formed on the lower DBR layer, generating light having a predetermined wavelength, and emitting the generated light through an aperture;
an upper DBR layer formed on the active layer;
a current transport layer formed on an upper surface of the upper DBR layer and transporting current;
an annular high resistance region buried in the current transport layer and blocking flow of current, wherein:
the high resistance region has an opening in a central portion thereof;
a first current injection channel allowing current to be injected toward a central portion of the aperture is formed inside the opening of the high resistance region;
a second current injection channel allowing current to be injected toward an edge of the aperture is formed in the current transport layer outside the high resistance region: and
the annular high resistance region has an inner diameter smaller than a diameter of the aperture and an outer diameter greater than the diameter of the aperture.

7. The surface emitting laser device of claim 6, wherein the annular high resistance region is formed using an ion implanting method.

8. The surface emitting laser device of claim 6 further comprising a tunnel junction layer between the active layer and the upper DBR layer to increase a resistance in a vertical direction.

9. The surface emitting laser device of claim 8, wherein both the lower DBR layer and the upper DBR layer are n-type DBR layers doped with an n-type dopant, and the current transport layer is formed of an n-type semiconductor material.

10. The surface emitting laser device of claim 6 further comprising an external mirror that is disposed a predetermined distance above the current transport layer, externally outputs a portion of the light generated in the active layer to the outside, and reflects the rest of the light to be reabsorbed by the active layer.

11. The surface emitting laser device of claim 10 further comprising an anti-reflection layer formed on the current transport layer.

12. The surface emitting laser device of claim 10 further comprising a SHG crystal that is disposed between the current transport layer and the external mirror and doubles a frequency of the light generated in the active layer.

13. A surface emitting laser device comprising:
a substrate;
a lower DBR layer formed on the substrate;
an active layer formed on the lower DBR layer and generating light having a predetermined wavelength;
an upper DBR layer formed on the active layer;
a current shielding layer formed on the upper DBR layer and blocking flow of current into the upper DBR layer;
a current transport layer formed on the current shielding layer and transporting current;
a first current passing layer vertically extending through central portions of the current transport layer and the current shielding layer to contact the upper DBR layer; and
a second current passing layer vertically extending through edges of the current transport layer and the current shielding layer to contact the upper DBR layer.

14. The surface emitting laser device of claim 13, wherein
the first current passing layer allows current to be injected toward a central portion of an aperture, which is a light emitting region of the active layer, and has a smaller diameter than a diameter of the aperture, and
the second current passing layer allows current to be injected toward edges of the aperture and is located around the aperture.

15. The surface emitting laser device of claim 13, wherein
the lower DBR layer is an n-type DBR layer doped with an n-type dopant,
the upper DBR layer is a p-type DBR layer doped with a p-type dopant,
the current shielding layer is formed of one of an insulating material and an n-type semiconductor material, and
the current transport layer is formed of a p-type semiconductor material.

16. The surface emitting laser device of claim 15, wherein the first and second current passing layers are formed by diffusing a p-type dopant.

17. The surface emitting laser device of claim 16, wherein the p-type dopant includes at least one material selected from the group consisting of Zn, Mg, and C.

18. The surface emitting laser device of claim 13, wherein
the lower DBR layer is a p-type DBR layer doped with a p-type dopant,
the upper DBR layer is an n-type DBR layer doped with an n-type dopant,
the current shielding layer is formed of one of an insulating material and a p-type semiconductor material, and
the current transport layer is formed of an n-type semiconductor material.

19. The surface emitting laser device of claim 18, wherein the first and second current passing layers are formed by diffusing an n-type dopant.

20. The surface emitting laser device of claim 13 further comprising a tunnel junction layer between the active layer and the upper DBR layer to increase a resistance in a vertical direction.

21. The surface emitting laser device of claim 20, wherein both the lower DBR layer and the upper DBR layer are n-type DBR layers doped with an n-type dopant, the current shielding layer is formed of one of an insulating material and a p-type semiconductor material, and the current transport layer is formed of an n-type semiconductor material.

22. The surface emitting laser device of claim 21, wherein the first and second current passing layers are formed by diffusing an n-type dopant.

23. The surface emitting laser device of claim 13 further comprising an external mirror that is disposed a predetermined distance above the current transport layer, externally outputs a portion of the light generated in the active layer, and reflects the rest of the light to be reabsorbed by the active layer.

24. A surface emitting laser device comprising:
a substrate;
a lower DBR layer formed on the substrate;
an active layer formed on the lower DBR layer and generating light having a predetermined wavelength and;
an upper DBR layer formed on the active layer;
a first current transport layer formed on the upper DBR layer;
a current shielding layer formed on the first current transport layer and blocking flow of current into the first current transport layer;
a second current transport layer formed on the current shielding layer;
a first current passing layer vertically extending through central portions of the second current transport layer and the current shielding layer to contact at least an upper surface of first current transport layer; and
a second current passing layer vertically extending through edges of the second current transport layer and the current shielding layer to contact at least an upper surface of first current transport layer.

25. The surface emitting laser device of claim 1, further comprising:
an upper DBR formed between the active layer and the current shielding layer,
wherein the first current passing layer partially extends into the upper DBR, and wherein the second current passing layer partially extends into the upper DBR.

26. The surface emitting laser device of claim 25, wherein there is no high resistance region entirely buried within the upper DBR layer.

27. The surface emitting laser device of claim 6, wherein there is no high resistance region entirely buried within the upper DBR layer.

28. The surface emitting laser device of claim 8, wherein a doping concentration of the tunnel junction layer substantially ranges between $5 \times 10^{18}/cm^2$ to $5 \times 10^{19}/cm^2$.

29. The surface emitting laser device of claim 13, wherein there is no high resistance region entirely buried within the upper DBR layer.

30. The surface emitting laser device of claim 20, wherein a doping concentration of the tunnel junction layer substantially ranges between $5 \times 10^{18}/cm^2$ to $5 \times 10^{19}/cm^2$.

31. The surface emitting laser device of claim 24, wherein there is no high resistance region entirely buried within the upper DBR layer.

32. The surface emitting laser device of claim 6, further comprising:
an electrode having an opening in a central portion thereof and formed on the conductive layer, wherein:
the electrode has an inner diameter greater than an inner diameter of the high resistance regions;
the electrode has an outer diameter greater than an outer diameter of the high resistance region, and the outer diameter of the high resistance region is greater than the diameter of the aperture such that the second current injection channel is formed outside the outer diameter of the high resistance region in the conductive layer; and
the electrode having the outer diameter greater than the outer diameter of the high resistance region and the inner diameter greater than the inner diameter of the high resistance region is configured to cause current to be injected through both the first current injection channel and the second current injection channel to apply current substantially uniformly across the diameter of the aperture.

* * * * *